US006925731B2

(12) United States Patent
Nishimura et al.

(10) Patent No.: US 6,925,731 B2
(45) Date of Patent: Aug. 9, 2005

(54) THIN FILM FORMING APPARATUS CLEANING METHOD

(75) Inventors: Kazuaki Nishimura, Shiroyama-Machi (JP); Yukio Tojo, Shiroyama-Machi (JP); Phillip Spaull, Shiroyama-Machi (JP); Kenji Tago, Shiroyama-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/479,718

(22) PCT Filed: Feb. 20, 2002

(86) PCT No.: PCT/JP02/01492

§ 371 (c)(1),
(2), (4) Date: Dec. 5, 2003

(87) PCT Pub. No.: WO02/101805

PCT Pub. Date: Dec. 19, 2002

(65) Prior Publication Data

US 2005/0090123 A1    Apr. 28, 2005

(30) Foreign Application Priority Data

Jun. 8, 2001  (JP) ............................. 2001-174129
Oct. 29, 2001  (JP) ............................. 2001-331590

(51) Int. Cl.[7] .............................................. F26B 5/04
(52) U.S. Cl. ....................................................... 34/406
(58) Field of Search ........................... 34/406; 134/902

(56) References Cited

U.S. PATENT DOCUMENTS 4,872,938 A * 10/1989 Davis et al. ........... 156/345.54
5,363,396 A * 11/1994 Webb et al. ................... 372/57
5,966,623 A * 10/1999 Khosla et al. ............... 438/471
6,030,932 A *  2/2000 Leon et al. .................. 510/175
6,374,831 B1    4/2002 Chandran et al.

FOREIGN PATENT DOCUMENTS

| JP | 03-293726 | 12/1991 |
| JP | 4-96222 | 3/1992 |
| JP | 2000-265276 | 9/2000 |
| JP | 2001-189273 | 7/2001 |
| JP | 2001-267241 | 9/2001 |
| JP | 2002-33289 | 1/2002 |

OTHER PUBLICATIONS

Notification of Reason for Rejection, mailed Dec. 24, 2002.
Translation of Notification of Reason for Rejection, mailed Dec. 24, 2002.
International Preliminary Examination Report (PCT/IPEA/409) (translated) issued for PCT/JP2002/001492.
Notification of Transmittal of Copies of Translation of the International Preliminary Examination Report (PCT/IB/338) issued for PCT/JP2002/001492.

* cited by examiner

*Primary Examiner*—Stephen Gravini
(74) *Attorney, Agent, or Firm*—Smith, Gambrell & Russell, LLP (57) ABSTRACT

A cleaning process for cleaning a thermal processing apparatus includes: a heating step of heating an interior of a reaction tube at 300° C., and a cleaning step of removing deposits deposited in the thermal processing apparatus. In the cleaning step, a cleaning gas containing fluorine gas, chlorine gas and nitrogen gas is supplied into the interior of the reaction tube heated at 300° C. to remove silicon nitride so to clean an interior of the thermal processing apparatus.

22 Claims, 9 Drawing Sheets

| | CLEANING CONDITIONS | | | | ETCH RATE | | | SELECTIVITY | |
|---|---|---|---|---|---|---|---|---|---|
| | TEMPERATURE | $F_2$ | $Cl_2$ | $N_2$ | $Si_3N_4$ | QUARTZ | SiC | $Si_3N_4$/QUARTZ | $Si_3N_4$/SiC |
| EXAMPLE 1 | 300 | 2 | 0.35 | 8 | 227.5 | 25.7 | 30.9 | 8.8 | 7.9 |
| COMPARATIVE EXAMPLE 1 | 300 | 2 | 0 | 8 | 30.6 | 3.5 | 14.7 | 8.8 | 2.1 |
| COMPARATIVE EXAMPLE 2 | 400 | 2 | 0 | 8 | 313.3 | 110.7 | 318.7 | 2.8 | 1.0 |

(°C) (l/min) (nm/min)

| | CLEANING CONDITIONS | | | | ETCH RATE | | | SELECTIVITY | |
|---|---|---|---|---|---|---|---|---|---|
| | TEMPERATURE | F₂ | HF | N₂ | Si₃N₄ | QUARTZ | SiC | Si₃N₄/QUARTZ | Si₃N₄/SiC |
| EXAMPLE 2 | 300 | 1.5 | 0.5 | 8 | 239.5 | 4.3 | 5.3 | 55.7 | 45.2 |
| EXAMPLE 3 | 300 | 1 | 1 | 8 | 285.2 | 3.3 | 4.9 | 86.4 | 58.2 |
| EXAMPLE 4 | 300 | 0.5 | 1.5 | 8 | 244.3 | 12.1 | 3.7 | 20.2 | 66.0 |
| EXAMPLE 5 | 300 | 2 | 2 | 8 | 383.0 | 2.2 | 8.9 | 172.5 | 43.0 |
| COMPARATIVE EXAMPLE 3 | 300 | 0 | 2 | 8 | 54.7 | 11.6 | 0.8 | 4.7 | 68.4 |
| COMPARATIVE EXAMPLE 4 | 400 | 1 | 1 | 8 | 571.8 | 34.5 | 131.4 | 16.6 | 4.4 |

(°C) (l/min)    (nm/min)

| | CLEANING CONDITIONS | | | | ETCH RATE | | | SELECTIVITY | |
|---|---|---|---|---|---|---|---|---|---|
| | TEMPERATURE | $F_2$ | $NH_3$ | $N_2$ | $Si_3N_4$ | QUARTZ | SiC | $Si_3N_4$/QUARTZ | $Si_3N_4$/SiC |
| EXAMPLE 6 | 300 | 1.78 | 0.17 | 8.05 | 196 | 7.1 | 6.5 | 27.6 | 30.2 |
| EXAMPLE 7 | 300 | 1.55 | 0.34 | 8.1 | 264.7 | 4.7 | 6.9 | 56.3 | 38.4 |
| EXAMPLE 8 | 300 | 1.32 | 0.53 | 8.16 | 206.5 | 11 | 12.3 | 18.8 | 16.8 |

(°C)　(l/min)　　　　(nm/min)

| | CLEANING CONDITIONS | | | ETCH RATE | | | SELECTIVITY | |
|---|---|---|---|---|---|---|---|---|
| TEMPERATURE | $F_2$ | $H_2$ | $N_2$ | $Si_3N_4$ | QUARTZ | SiC | $Si_3N_4$ /QUARTZ | $Si_3N_4$ /SiC |
| EXAMPLE 9 | 300 | 1.75 | 0.37 | 8 | 264 | 5.5 | 4.1 | 48 | 64.4 |
| EXAMPLE 10 | 300 | 1.5 | 0.61 | 8 | 285 | 7.2 | 4.5 | 39.6 | 63.3 |
| EXAMPLE 11 | 300 | 1.25 | 0.75 | 8 | 246 | 3.9 | 4.2 | 63.1 | 58.6 |

(°C)  (l/min)     (nm/min)

THIN FILM FORMING APPARATUS CLEANING METHOD

TECHNICAL FIELD

The present invention relates to a thin film deposition apparatus cleaning method and, more specifically, to a thin film deposition apparatus cleaning method, for removing deposits deposited on the inner surface of the thin film deposition apparatus during a process for forming a thin film on a workpiece, such as a semiconductor wafer.

BACKGROUND ART

Figure 15:
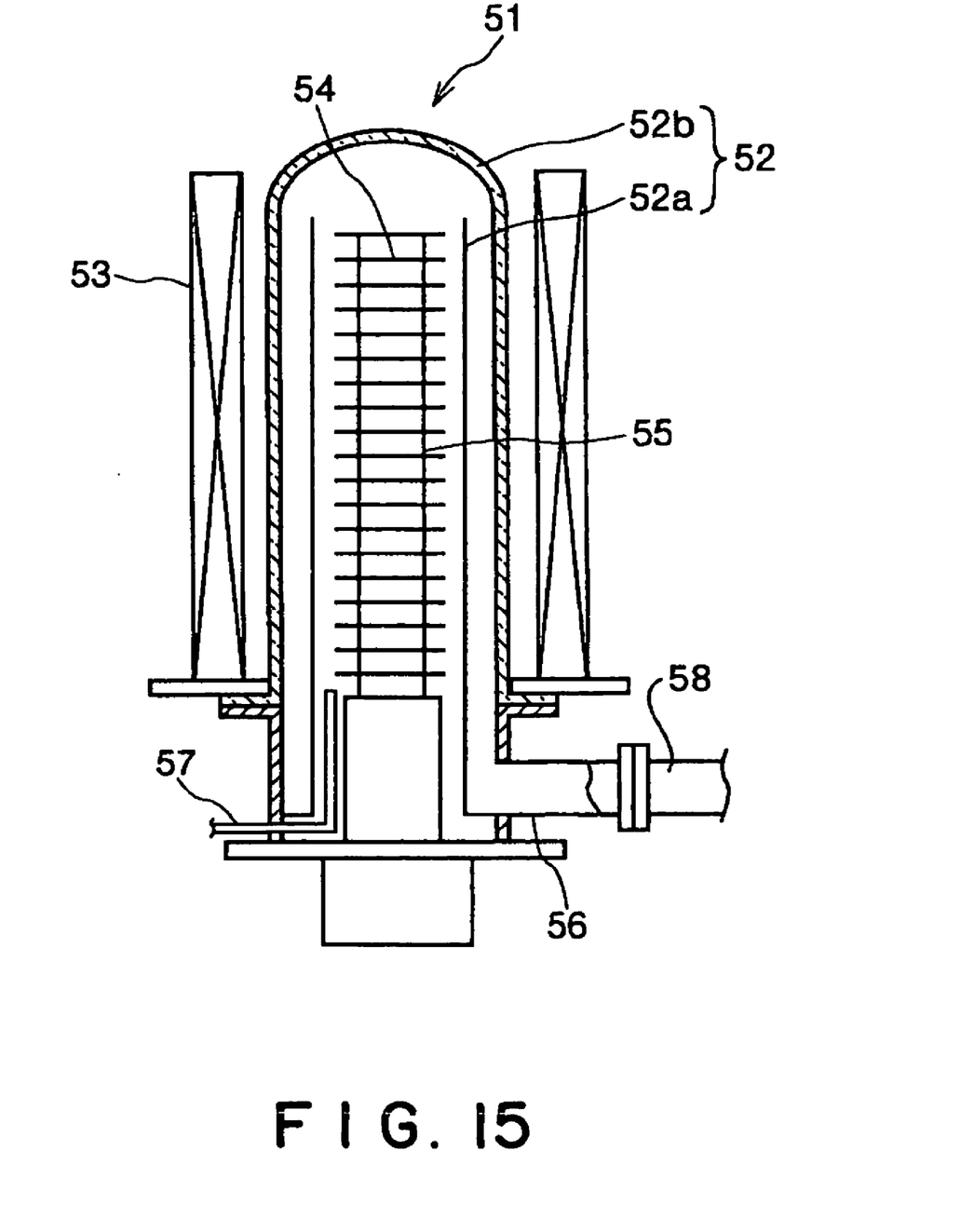
FIG. 15 is a schematic view of a thermal processing apparatus of assistance in explaining the adhesion of reaction products to the thermal processing apparatus.

A semiconductor device fabricating procedure includes a thin film deposition process, such as a CVD process (chemical vapor deposition process), for forming a thin film, such as a silicon dioxide film, a silicon nitride film or the like, on a workpiece, such as a semiconductor wafer. Such a thin film deposition process uses a thermal processing apparatus as shown in FIG. 15 to form a thin film on a semiconductor wafer by the following procedure.

A heater 53 heats a double-wall reaction tube 52 consisting of an inner tube 52a and an outer tube 52b at a predetermined temperature. A wafer boat 55 holding a plurality of semiconductor wafers 54 is loaded into the reaction tube 52 (inner tube 52a). Gases in the reaction tube 52 are discharged through an exhaust port 56 to set the interior of the reaction tube 52 at a predetermined reduced pressure. After the interior of the reaction tube 52 has been set at the predetermined reduced pressure, process gases are supplied through a gas supply pipe 57 into the inner tube 52a. The process gases undergo a thermal reaction, and a reaction product produced by the thermal reaction deposits on the surfaces of the semiconductor wafers 54 to form thin films on the surfaces of the semiconductor wafers 54.

Waste gases produced by the thin film deposition process are discharged outside the thermal processing unit 51 through an exhaust pipe 58 connected to the exhaust port 56. A trap and a scrubber and such, not shown, are placed in the exhaust pipe 58. The trap removes the reaction product and other substances contained in the waste gases to discharge the waste gases from the thermal processing unit 51 after rendering the waste gases harmless.

The reaction product produced by the thin film deposition process deposits not only on (adheres not only to) the surfaces of the semiconductor wafers 54, but also on (but also to) the inner surfaces of the thermal processing unit 51 including the inner surface of the inner tube 52a and the surfaces of jigs. If the thin film deposition process is continued in the thermal processing unit 51 with the reaction product adhering to the inside surfaces of the thermal processing unit 51, the reaction product will eventually come off and produce particles. The particles contaminate the semiconductor wafers 54, which reduces the yield of semiconductor devices which are manufactured using the semiconductor wafers 54 contaminated with those particles.

To avoid such troubles, a cleaning process is carried out after the thin film deposition process has been repeated several times to clean the thermal processing unit 51. The cleaning process heats the reaction tube 52 at a predetermined temperature by the heater 53, supplies a cleaning gas, such as a fluoride gas, into the heated reaction tube 52 to remove by etching the reaction product adhering to the inner surfaces of the thermal processing unit 51.

The fluoride gas for such a purpose is a perfluorocompound, such as $CF_4$, $C_2F_6$, $NF_3$ or $SF_6$. Generally, the perfluorocompond has a long life. For example, $CF_4$ lasts 50,000 years or longer. The emission of the perfluorocompound into the atmosphere causes global warming. Since there is the possibility that the use of the fluoride gas as a cleaning gas negatively affects the global environment, studies have been made to use a cleaning gas other than the perfluorocompound, such as fluorine gas ($F_2$).

The interior of the reaction tube 52 must be heated at the predetermined temperature to make the cleaning gas etch the reaction product at a desired etch rate to remove the reaction product deposited on the inner surfaces of the thermal processing unit 51. The interior of the reaction tube 52 needs to be heated at a high temperature of, for example, 400° C., to etch the deposited reaction product at a desired etch rate using fluorine gas as a cleaning gas.

If the interior of the reaction tube 52 is heated at such a high temperature of 400° C., the reaction tube 52 formed of quartz and the jigs formed of silicon carbide (SiC) are etched at etch rates higher than that at which the reaction product is etched, and reaction product selectivity, i.e., the ratio between etch rates for the reaction product and the material, decreases. Consequently, the reaction tube 52 formed of quartz, and the jigs formed of SiC are deteriorated when the reaction deposit is removed.

DISCLOSURE OF THE INVENTION

The present invention has been made in view of the foregoing problems and it is therefore an object of the present invention to provide a thin film deposition apparatus cleaning method capable of removing deposits deposited inside the thin film deposition apparatus, suppressing the deterioration of a reaction vessel and jigs.

Another object of the present invention is to provide a thin film deposition apparatus cleaning method capable of etching deposits deposited inside the thin film deposition apparatus at a high etch rate.

A third object of the present invention to provide a thin film deposition apparatus cleaning method capable of removing deposits deposited inside the thin film deposition apparatus with the interior of a reaction vessel heated at a low temperature.

According to the present invention, a thin film deposition apparatus cleaning method of cleaning a thin film deposition apparatus by removing deposits adhering to an inner surfaces of the thin film deposition apparatus after depositing thin films on workpieces by supplying a process gas into a reaction vessel included in the thin film deposition apparatus comprises the steps of: heating an interior of the reaction vessel at a predetermined temperature; and cleaning an interior of the thin film deposition apparatus by supplying a cleaning gas containing fluorine gas and an additive gas capable of promoting the activation of the fluorine gas into the reaction vessel heated at the predetermined temperature, heating the cleaning gas at a predetermined temperature to activate the fluorine gas contained in the cleaning gas, and removing the deposits with the activated fluorine gas.

According to the present invention, the cleaning gas is supplied into the reaction vessel heated at the predetermined temperature, the cleaning gas supplied into the reaction vessel is heated at the predetermined temperature, and thereby the fluorine gas contained in the cleaning gas is activated. Since the cleaning gas contains the additive gas capable of activating the fluorine gas, the activation of the fluorine gas is promoted. Since the activation of the fluorine gas is thus promoted, the deposits adhering to the interior of the thin film deposition apparatus can be etched at a high etch rate. The etch rate for the deposits is high and hence the temperature in the reaction vessel may be low. Thus, the temperature in the reaction vessel may be low during the removal of deposits deposited in the thin film deposition apparatus.

According to the thin film deposition apparatus cleaning method of the present invention, the deposits are removed and the interior of the thin film deposition apparatus is cleaned by supplying the cleaning gas containing fluorine gas and the additive gas capable of promoting the activation of the fluorine gas and of increasing the etch rate for the deposits without decreasing selectivity, i.e., the ratio of the etch rate for the deposit to that for the materials forming the internal members of the thin film deposition apparatus, into the reaction vessel in the cleaning step.

According to the present invention, the cleaning gas supplied into the reaction vessel etches the deposits at a high etch rate without decreasing selectivity with respect to the materials forming the internal members of the thin film deposition apparatus owing to the agency of the additive gas. Consequently, the deposits deposited in the thin film deposition apparatus can be removed, suppressing the deterioration of the internal members of the thin film deposition apparatus, such as the reaction vessel and the jigs.

According to the thin film deposition apparatus cleaning method of the present invention, chlorine gas, hydrogen fluoride gas, ammonia gas or hydrogen gas is used as an additive gas.

According to the thin film deposition apparatus cleaning method of the present invention the deposits to are removed to clean the interior of the thin film deposition apparatus by supplying a cleaning gas containing fluorine gas and chlorine gas into the reaction vessel heated at the predetermined temperature in the cleaning step.

According to the present invention, the cleaning gas contains fluorine gas and chlorine gas, and etches the deposits at a high etch rate without decreasing selectivity with respect to the materials forming the internal members of the thin film deposition apparatus. Consequently, the deposits deposited in the thin film deposition apparatus can be removed, suppressing the deterioration of the internal members of the thin film deposition apparatus, such as the reaction vessel and the jigs.

According to the thin film deposition apparatus cleaning method of the present invention, the deposits are removed to clean the interior of the thin film deposition apparatus by supplying a cleaning gas containing fluorine gas and hydrogen fluoride gas into the reaction vessel heated at a predetermined temperature in the cleaning step.

According to the present invention, the cleaning gas contains fluorine gas and hydrogen fluoride gas, and the deposits are etched at a high etch rate without decreasing selectivity with respect to the materials forming the internal members of the thin film deposition apparatus. Consequently, the deposits deposited in the thin film deposition apparatus are removed, suppressing the deterioration of the reaction vessel and the jigs.

According to the thin film deposition apparatus cleaning method of the present invention, the cleaning gas containing fluorine gas and hydrogen fluoride gas supplied such that the flow rate ratio between fluorine gas is supplied and hydrogen fluoride gas is in the range of 1:3 to 3:1.

When fluorine gas and hydrogen fluoride gas of the cleaning gas is supplied such that the flow rate ratio between fluorine gas and hydrogen fluoride gas is in the range of 1:3 to 1:1, the etch rate for the deposits deposited in the thin film deposition apparatus, and selectivity with respect to the materials forming the internal members of the thin film deposition apparatus are high.

According to the thin film deposition apparatus cleaning method of the present invention, the cleaning gas containing fluorine gas and hydrogen fluoride gas is supplied such that the flow rate ratio between fluorine gas are supplied and hydrogen fluoride gas is 1:1.

In this case, selectivity with respect to quartz generally used for forming the internal members of thin film deposition apparatuses is high.

According to the thin film deposition apparatus cleaning method of the present invention, fluorine gas and hydrogen fluoride gas are supplied respectively at flow rates not lower than 2 l/min.

In this case, the deposits deposited in the thin film deposition apparatus is etched at a high etch rate, and selectivity with respect to quartz is high.

According to the thin film deposition apparatus cleaning method of the present invention, the deposits are removed to clean the interior of the thin film deposition apparatus by supplying a cleaning gas containing fluorine gas and ammonia gas into a reaction vessel heated at a predetermined temperature.

According to the present invention, the cleaning gas containing fluorine gas and ammonia gas etches the deposits at a high etch rate without decreasing selectivity with respect to the materials forming the internal members of the thin film deposition apparatus. Consequently, the deposits deposited in the thin film deposition apparatus are removed, suppressing the deterioration of the reaction vessel and the jigs.

According to the thin film deposition apparatus cleaning method of the present invention, the cleaning gas containing fluorine gas and ammonia gas is supplied such that the flow rate ratio between fluorine gas and ammonia gas is in the range of 2:1 to 10:1.

In this case, the deposits deposited in the thin film deposition apparatus are etched at a high etch rate, and selectivity with respect to the materials forming the internal members of the thin film deposition apparatus is high.

According to the thin film deposition apparatus cleaning method of the present invention, the deposits are removed to clean the interior of the thin film deposition apparatus by supplying a cleaning gas containing fluorine gas and hydrogen gas is supplied into the reaction vessel heated at a predetermined temperature in the cleaning step.

According to the present invention, the cleaning gas containing fluorine gas and hydrogen gas etches the deposits at a high etch rate without decreasing selectivity with respect to the materials forming the internal members of the thin film deposition apparatus. Consequently, the deposits deposited in the thin film deposition apparatus are removed, suppressing the deterioration of the reaction vessel and the jigs.

According to the thin film deposition apparatus cleaning method of the present invention, the cleaning gas containing fluorine gas and hydrogen gas is supplied such that the flow rate ratio between fluorine gas and hydrogen gas is in the range of 5:1 to 5:3.

In this case, the deposits deposited in the thin film deposition apparatus are etched at a high etch rate, and selectivity with respect to the materials forming the internal members of the thin film deposition apparatus is high. Silicon nitride can be etched at a high etch rate even if the flow rate of hydrogen gas is not controlled precisely. Consequently, the flow rate of hydrogen gas can easily be controlled.

According to the thin film deposition apparatus cleaning method of the present invention, the cleaning gas containing fluorine gas and hydrogen gas is supplied such that the flow rate ratio between fluorine gas and hydrogen gas is 5:3.

In this case, the etch rate for quartz generally used for forming reaction vessels is low, so that the deposits deposited in the thin film deposition apparatus can be removed, suppressing the deterioration of the reaction vessel.

In the thin film deposition apparatus cleaning method according to the present invention, the materials forming the internal members of the thin film deposition apparatus include at least either quartz or silicon carbide.

According to the thin film deposition apparatus cleaning method of the present invention, the interior of the reaction vessel is heated at a temperature below 400° C. in the heating step.

According to the thin film deposition apparatus cleaning method of the present invention, the interior of the reaction vessel is heated at a temperature in the range of 250° C. to 380° C. in the heating step.

By heating the interior of the reaction vessel at temperatures in the aforesaid range, the deposits can be etched at a high etch rate, while suppressing the deterioration of the reaction vessel and the jigs.

According to the thin film deposition apparatus cleaning method of the present invention, the cleaning gas is diluted with a diluent gas to produce a diluted cleaning gas, and the diluted cleaning gas is supplied into the reaction vessel.

According to the thin film deposition apparatus cleaning method of the present invention, uses an inert gas is used as the diluent gas.

By using the diluted cleaning gas, a cleaning time can be easily set in the cleaning step.

In the thin film deposition apparatus cleaning method according to the present invention, silicon nitride films are formed on the workpieces, and in the cleaning step silicon nitride deposited in the thin film deposition apparatus is removed, when depositing the silicon nitride films on the workpieces with the cleaning gas.

According to the present invention, a thin film deposition apparatus cleaning method of cleaning a thin film deposition apparatus by removing deposits adhering to the inner surface of an exhaust pipe after forming thin films on workpieces by supplying a process gas in a reaction vessel included in the thin film deposition apparatus and discharging gases from the reaction vessel in to the exhaust pipe comprises the steps of: heating an interior of the exhaust pipe at a predetermined temperature; and cleaning an interior of the exhaust pipe by supplying a cleaning gas containing fluorine gas and an additive gas capable of promoting the activation of the fluorine gas into the exhaust pipe heated at the predetermined temperature in the heating step, heating the cleaning gas at a predetermined temperature to activate the fluorine gas contained in the cleaning gas, and removing the deposits with the activated fluorine gas.

According to the thin film deposition apparatus cleaning method of the present invention, the cleaning gas is supplied through the reaction vessel into the exhaust pipe.

According to the thin film deposition apparatus cleaning method of the present invention, the cleaning gas is supplied through an inlet port formed in the exhaust pipe into the exhaust pipe.

BEST MODE FOR CARRYING OUT THE INVENTION

A thin film deposition apparatus cleaning method in a preferred embodiment according to the present invention will be described as applied to cleaning a batch-furnace vertical thermal processing apparatus (thin film deposition apparatus) 1 shown in FIG. 1. The thermal processing apparatus 1 (thin film deposition apparatus) 1 to which this embodiment is applied will be described.

Figure 1:
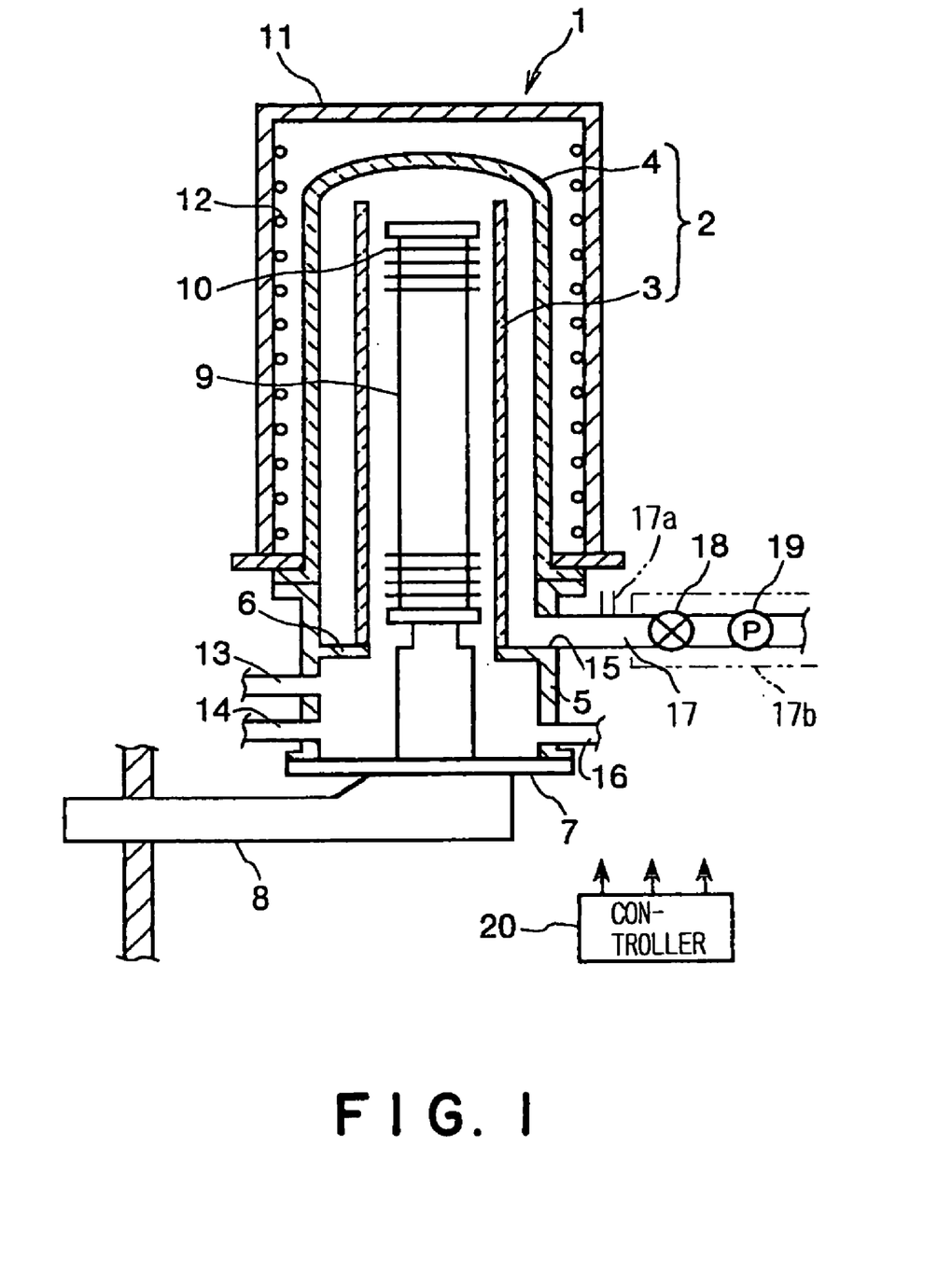
FIG. 1 is a schematic view of a thermal processing apparatus to which a thermal film deposition apparatus cleaning method in a preferred embodiment according to the present invention is applied.

Referring to FIG. 1, the thermal processing apparatus 1 has a substantially cylindrical reaction tube (reaction vessel) 2 in a vertical position, and an exhaust pipe 17 for carrying gases discharged from the reaction tube 2. The reaction tube (reaction vessel) 2 is a double-wall structure consisting of an inner tube 3, and a topped outer tube 4 covering the inner tube 3 so that an annular space is defined between the inner tube 3 and the outer tube 4. The inner tube 3 and the outer tube 4 are formed of a heat-resistant material, such as quartz.

The outer tube 4 is mounted on a manifold 5 formed of a stainless steel (SUS). The manifold 5 is joined airtightly to the lower end of the outer tube 4. The inner tube 3 is supported on a support ring 6 formed integrally with the manifold 5 so as to protrude from the inner circumference of the manifold 5.

A cover 7 is disposed under the manifold 5. A boat elevator 8 moves the cover 7 vertically. The boat elevator 8 raises the cover 7 to close the bottom of the manifold 5.

A wafer boat 9 formed of, for example, quartz is mounted on the cover 7. The wafer boat 9 is capable of holding a plurality of workpieces, for example, semiconductor wafers 10 at predetermined spacing in a vertical arrangement.

A heat-insulating member 11 is provided to surround the reaction tube 2. A heater 12 having a resistive heating element is attached to the inner surface of the side wall of the heat-insulating member 11.

A plurality of process gas supply pipes 13 are connected to the side wall of the manifold 5. Only one of the process gas supply pipes 13 is shown in FIG. 1. The process gas supply pipes 13 is open into the inner tube 3. For example, the process gas supply pipes 13 are connected to parts, below the support ring 6 (below the inner tube 3), of the side wall of the manifold 5. Process gases are introduced through the process gas supply pipes 13 into the inner tube 3 so as to be delivered to the semiconductor wafers 10.

A cleaning gas supply pipe 14 is connected to the side wall of the manifold 5 so as to open into the inner tube 3. A cleaning gas is introduced through the cleaning gas supply pipe 14 into the inner tube 3.

An exhaust port 15 is formed in a part, above the support ring 6, of the side wall of the manifold 5 so as to be open into the annular space between the inner tube 3 and the outer tube 4 of the reaction tube 2. Waste gases produced inside the inner tube 3 are discharged through the annular space between the inner tube 3 and the outer tube 4, and the exhaust port 15. A purge gas supply pipe 16 is connected to a part, below the exhaust port 15, of the side wall of the manifold 15 to supply nitrogen gas as a purge gas into the reaction tube 2.

The exhaust pipe 17 is connected airtightly to the exhaust port 15. The exhaust pipe 17 is provided with a valve 18, and a vacuum pump 19 below the valve 18. The opening of the valve 18 is adjusted to adjust the flow of gases through the exhaust pipe 17 to maintain the interior of the reaction tube 2 at a predetermined pressure. The vacuum pump 19 discharges gases from the reaction tube 2 through the exhaust pipe 17 and adjusts the pressure in the reaction tube 2.

A trap, a scrubber and such, not shown, are placed in the exhaust pipe 17 to discharge the waste gases discharged from the reaction tube 2 from the thermal processing apparatus 1 after rendering the waste gases harmless.

Figure 2:
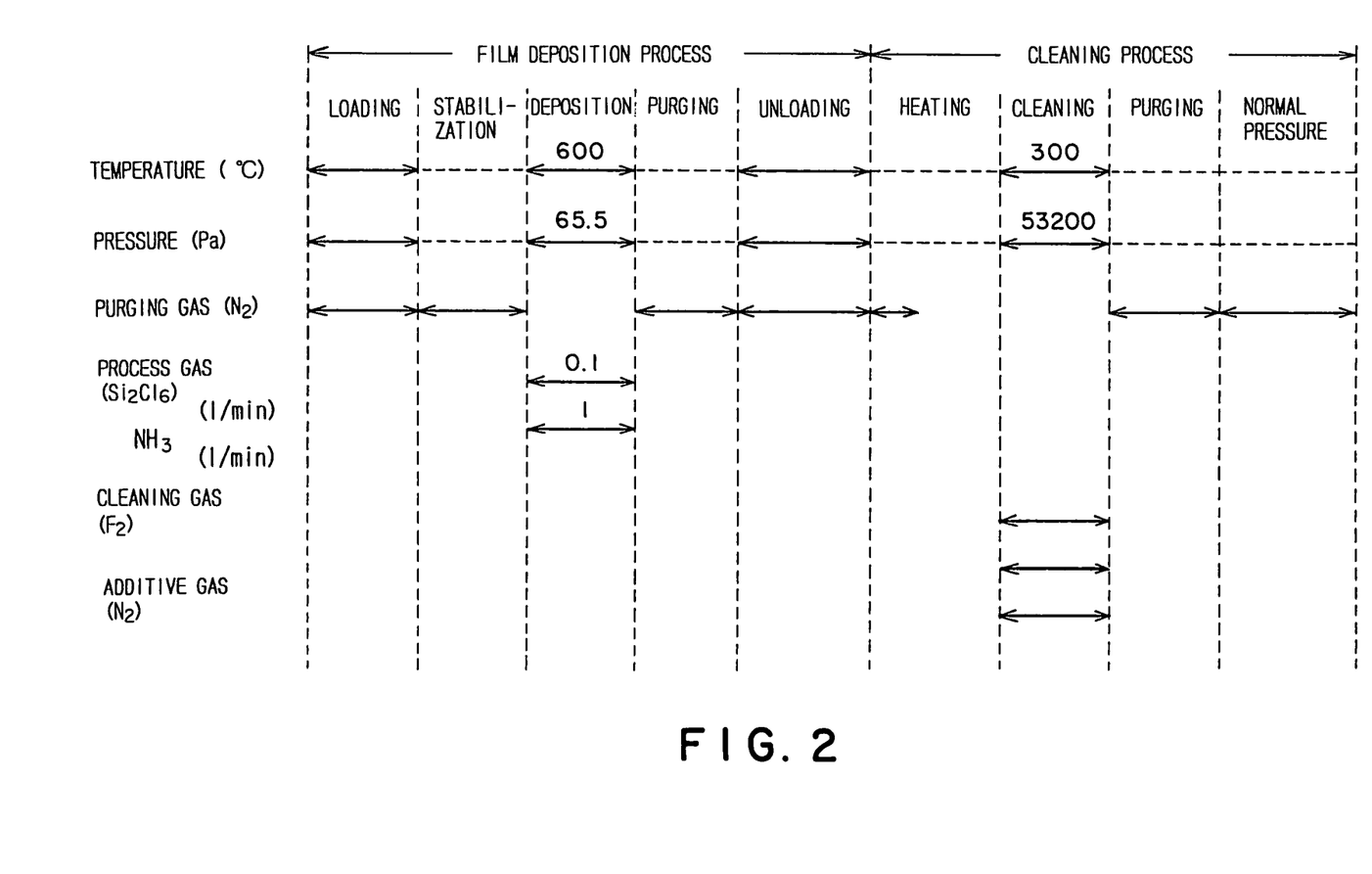
FIG. 2 is a diagram of a recipe of assistance in explaining the thermal film deposition apparatus cleaning method in the preferred embodiment according to the present invention.

A controller 20 is connected to the boat elevator 8, the heater 12, the process gas supply pipes 13, the cleaning gas supply pipes 14, the purge gas supply pipe 16, the valve 18 and the vacuum pump 19. The controller 20 includes a microprocessor and a process controller. The controller 20 measures the temperatures and pressures of controlled parts of the thermal processing apparatus 1, gives control signals produced on the basis of measured data to the controlled parts to control the controlled parts of the thermal processing apparatus 1 according to a recipe (sequence diagram) shown in FIG. 2.

A thin film deposition apparatus cleaning method in a preferred embodiment according to the present invention will be described as applied to cleaning the thermal processing apparatus 1. The thin film deposition apparatus cleaning method will be described as applied to removing silicon nitride deposited in the thermal processing apparatus 1 during a film deposition process for depositing silicon nitride films on semiconductor wafers 10 to clean the interior of the thermal processing apparatus 1, particularly, the interior of the reaction tube 2 with reference to the recipe shown in FIG. 2. In the following description, it is assumed that the controller 20 controls the operations of the components of the thermal processing apparatus 1.

First the film deposition process will be described.

The boat elevator 8 lowers the cover 7, and the wafer boat 9 holding semiconductor wafers 10 is mounted on the cover 7. A predetermined amount of nitrogen gas is supplied through the purge gas supply pipe 16 into the reaction tube 2, the boat elevator 8 raises the cover 7 to load the wafer boat 9 into the reaction tube 2. Thus. the semiconductor wafers 10 are contained in the inner tube 3 of the reaction tube 2, and the reaction tube 2 is sealed (Loading step), After the reaction tube 2 has been sealed, a predetermined nitrogen gas is supplied through the purge gas supply pipe 16 into the reaction tube 2, the opening of the valve 18 is controlled, and the vacuum pump 19 is actuated to discharge gases from the reaction tube 2 to start evacuating the reaction tube 2. The reaction tube 2 is evacuated until the pressure in the reaction tube 2 decreases to a predetermined pressure of, for example, 65.5 Pa (0.5 torr). In the meantime, the heater 12 heats the interior of the reaction tube 2 at, for example, 600° C. The pressure-decreasing operation and the heating operation are continued until the interior of the reaction tube 2 is stabilized at the predetermined pressure and the predetermined temperature (Stabilizing step).

After the interior of the reaction tube 2 has been stabilized at the predetermined pressure and the predetermined temperature, the supply of nitrogen gas through the purge gas supply pipe 16 is stopped. Then, hexachlorodisilane ($Si_2Cl_6$) and ammonia ($NH_3$) are supplied at predetermined supply rates, for example, 0.1 l/min and 1 l/m, respectively, through the process gas supply pipes 13 into the inner tube 3.

The hexachlorodisilane and ammonia introduced into the inner tube 3 are caused by heat in the reaction tube 2 to undergo a thermal decomposition reaction. Consequently, silicon nitride ($Si_3N_4$) deposits on the surfaces of the semiconductor wafers 10 in silicon nitride films ($Si_3N_4$ films) (Film deposition step).

After the silicon nitride films of a predetermined thickness have been formed on the surfaces of the semiconductor wafers 10, the supply of hexachlorodisilane and ammonia through the process gas supply pipes 13 is stopped. Then, the vacuum pump 19 is actuated, the opening of the valve 18 is controlled and, at the same time, a predetermined amount of nitrogen gas is supplied through the purge gas supply pipe 16 to discharge the gases from the reaction tube 2 through the exhaust pipe 17 (Purging step). Preferably, the gas discharging operation and the nitrogen gas supply operation to discharge gases from the reaction tube 2 are repeated several times to ensure that all the gases are discharged completely from the reaction tube 2.

Then, a predetermined amount of nitrogen gas is supplied through the purge gas supply pipe 16 into the reaction tube 2 to set the interior of the reaction tube at normal pressure. Subsequently, the boat elevator 8 lowers the cover 7 to unload the wafer boat holding the semiconductor wafers 10 from the reaction tube 2 (Unloading step).

Silicon nitride produced by the film deposition process deposits on (adhere to) not only the surfaces of semiconductor wafers 10, but also on the inner surfaces of the reaction tube 2, such as the inner surface of the inner tube 3 formed of quartz, and on jigs formed of SiC as the film deposition process is repeated several times. A cleaning process for removing silicon nitride deposited in the thermal processing apparatus 1 is performed after the film deposition process has been repeated a predetermined number of times. In the cleaning process supplies a cleaning gas containing fluorine gas ($F_2$), an additive gas for promoting the activation of fluorine gas, and nitrogen gas ($N_2$) as a diluent gas is supplied into the reaction tube 2 of the thermal processing apparatus 1. The cleaning process for cleaning the thermal processing apparatus 1 will be described.

After a predetermined amount of nitrogen gas has been supplied through the purge gas supply pipe 16 into the reaction tube 2, a wafer boat 9 not holding any semiconductor wafers is mounted on the cover 7. Then the boat elevator 8 raises the cover 7 so that the reaction tube 2 is sealed. Subsequently, the supply of nitrogen gas through the purge gas supply pipe 16 is stopped, gases are discharged from the reaction tube 2 to maintain the interior of the reaction tube 2 at a predetermined pressure of, for example, 53,200 Pa (400 torr), and the heater 12 heats the reaction tube 2 to heat the interior of the reaction tube 2 at a predetermined temperature of, for example, 300° C. (Heating step).

Then, a predetermined amount of the cleaning gas is supplied through the cleaning gas supply pipe 14 into the inner tube 3. The cleaning gas is heated in the inner tube 3. Consequently, the fluorine gas contained in the cleaning gas is activated and many reactive free atoms are produced. The additive gas contained in the cleaning gas promotes the activation of the fluorine gas. As the cleaning gas containing the activated fluorine gas flows from the interior of the inner tube 3 through the annular space formed between the inner tube 3 and the outer tube 4 into the exhaust pipe 17, the cleaning gas etches silicon nitride deposited on the inner and outer surfaces of the inner tube 3, the inner surface of the outer tube 4, the inner surface of the exhaust pipe 17, the boat 9, and the jigs including a heat-insulating tube and placed in the thermal processing apparatus 1. Thus, the silicon nitride deposited in the thermal processing apparatus 1 is removed (Cleaning step).

After the silicon nitride deposited in the thermal processing apparatus has been removed, the supply of the cleaning gas through the cleaning gas supply pipe 14 is stopped. Then, the valve 18 is opened properly, the vacuum pump 19 is actuated to discharge gases contained in the reaction tube 2 and, at the same time, nitrogen gas is supplied through the purge gas supply pipe 16 into the reaction tube 2 to purge the gases from the reaction tube 2 into the exhaust pipe 17 (Purging step). Preferably, the gas discharging operation and the nitrogen gas supply operation are repeated several times to ensure that all the gases are discharged completely from the reaction tube 2.

Then, the valve 18 is closed, a predetermined amount of nitrogen gas is supplied through the purge gas supply pipe 16 to set the interior of the reaction tube 2 at normal pressure (Normal pressure setting step). Then, the boat elevator 8 lowers the cover 7, and a wafer boat 9 holding semiconductor wafers 10 is mounted on the cover 7. Then, the film deposition process for depositing silicon nitride films on the semiconductor wafers 10 is started in the thus cleaned thermal processing apparatus 1.

The etch rates at which the cleaning gas etches materials, and selectivities (etching selectivities) of the cleaning gases with respect to materials were measured to verify the effect of the embodiment of the present invention. Each cleaning gas contained fluorine gas, an additive gas, and a diluent gas, such as nitrogen gas. The additive gas that promotes the activation of fluorine gas was chlorine gas ($Cl_2$), hydrogen fluoride gas (HF), ammonia gas ($NH_3$) or hydrogen gas ($H_2$). A thin film deposition apparatus cleaning method in Example 1 used chlorine gas, thin film deposition apparatus cleaning methods in Examples 2 to 5 used hydrogen fluoride gas, thin film deposition apparatus cleaning methods in Examples 6 to 8 used ammonia gas, and thin film deposition apparatus cleaning methods in Examples 9 to 11 used hydrogen gas as additive gases, respectively.

Three kinds of specimens, namely, specimens formed of quartz, specimens formed of SiC, specimens prepared by depositing 3 $\mu$m thick silicon nitride films on quartz chips, were subjected to cleaning experiments. The specimens were held on a wafer boat 9, the wafer boat 9 was placed in the reaction tube 2, and the cleaning gases were supplied into the reaction tube 2 to clean the specimens. Then, the specimens thus cleaned were measured to determine etch rates and selectivities for the specimens. Etch rates were calculated from weight changes of the specimens caused by the cleaning process. The interior of the reaction tube 2 was heated at 300° C., and the pressure in the reaction tube 2 was adjusted to 53,200 Pa (400 torr) for the cleaning experiments.

Selectivity (etching selectivity) is an etch rate ratio between the materials of the specimens. For example, silicon nitride selectivity with respect to quartz is the ratio of silicon nitride etch rate to quartz etch rate. The etch rates for specimens were determined by the types and supply rate of additive gases, and the supply rate of the diluent gas.

EXAMPLE 1

Figure 3:
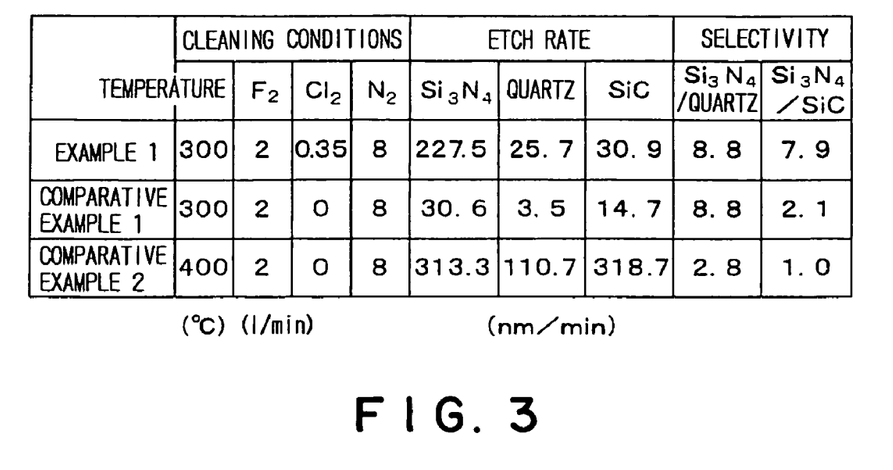
FIG. 3 is a table of cleaning conditions and results of execution of the thermal film deposition apparatus cleaning method using chlorine gas as an additive gas.
Figure 4:
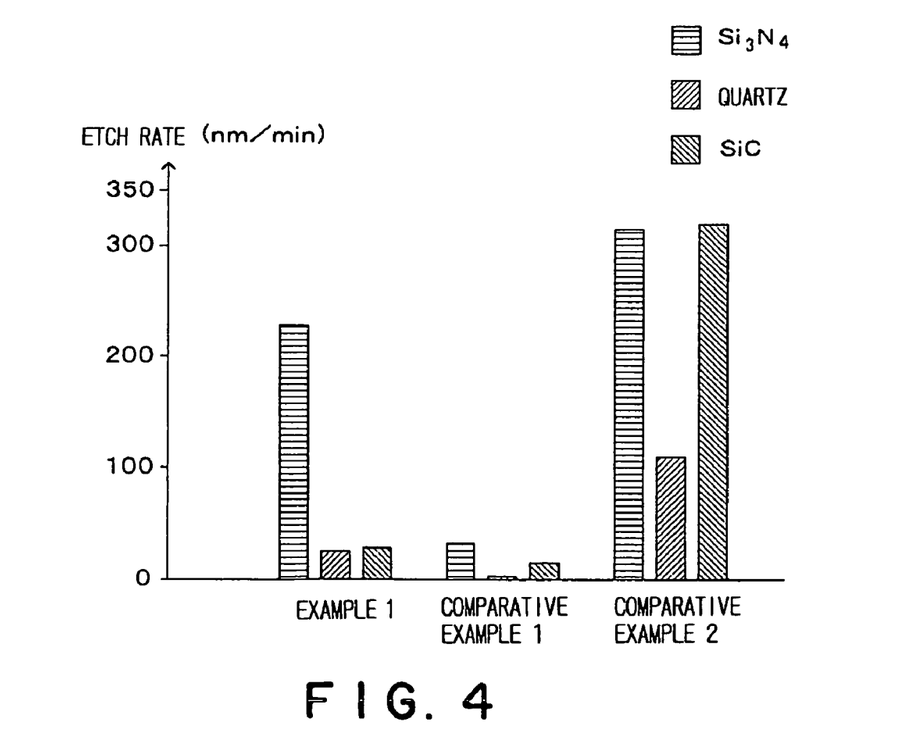
FIG. 4 is a graph showing etch rates at which materials are etched by using cleaning gases containing chlorine gas as an additive gas.
Figure 5:
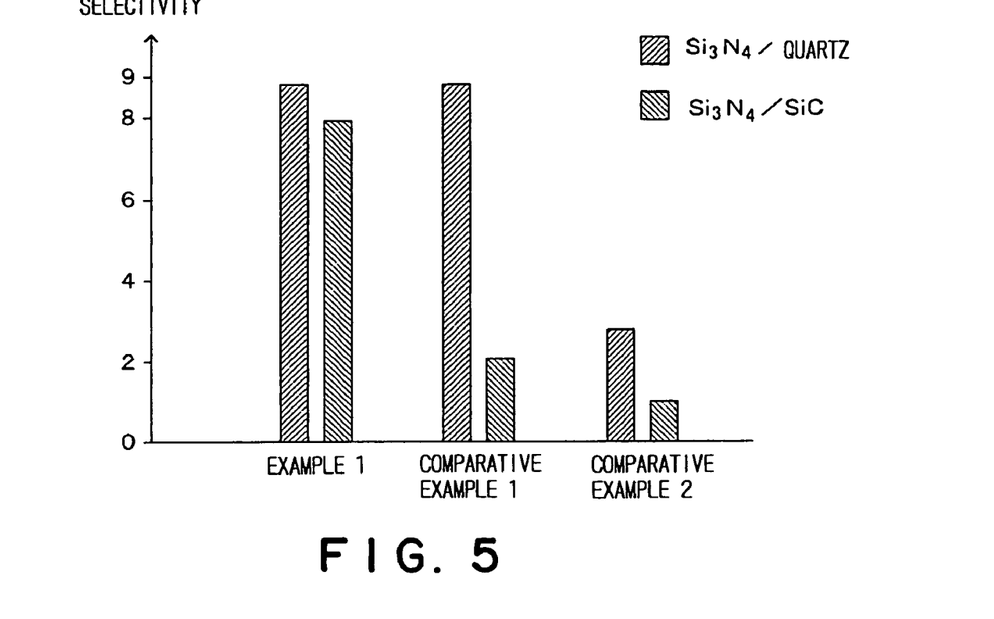
FIG. 5 is a graph showing selectivities with respect to materials when cleaning gases containing chlorine gas as an additive gas are used.

In a thin film deposition apparatus cleaning method in Example 1, fluorine gas, chlorine gas and nitrogen gas are supplied at 2 l/min, 0.35 l/min and 8 l/min, respectively, that is to say, a cleaning gas is supplied at 10.35 l/min through the cleaning gas supply pipe 14 into the reaction tube 2. FIGS. 3 to 5 show measured etch rates, and measured $Si_3N_4$ selectivities when the specimens were cleaned by the thin film deposition apparatus cleaning method in Example 1 using chlorine gas as an additive gas, together with those in a thin film deposition apparatus cleaning method in Comparative example 1 using a cleaning gas containing fluorine gas and nitrogen gas and not containing chlorine gas, and those in a thin film deposition apparatus cleaning method in Comparative example 2 using a cleaning gas containing fluorine gas and nitrogen gas and heating the interior of the reaction tube 2 at 400° C.

It is known from the comparative examination of data on the results of cleaning by Example 1 and Comparative example 1 shown in FIGS. 3 and 4 that the cleaning gas containing chlorine gas is capable of etching silicon nitride at a high etch rate without heating the reaction tube 2 at an elevated temperature. It is considered that the chlorine gas contained in the cleaning gas promoted the activation of the cleaning gas.

It is known from the comparative examination of data on the results of cleaning by Example 1 and Comparative example 1 shown in FIGS. 3 and 4 that $Si_3N_4$ selectivities with respect to quartz and SiC are high when the cleaning gas containing chlorine gas is used because the rates of increases in etch rates for quartz and SiC are smaller than that of increase in the etch rate for $Si_3N_4$. Thus, $Si_3N_4$ selectivity does not decrease when the cleaning gas containing chlorine gas is used, and silicon nitride adhering to the inner surfaces of the reaction tube 2 can be removed without deteriorating the reaction tube 2 and the jigs by using the cleaning gas containing chlorine gas. Particularly, the $Si_3N_4$ selectivity with respect to SiC achieved by Example 1 is about four times that achieved by Comparative example 1 and is about eight times that achieved by Comparative example 2. Thus, Example 1 is effective in suppressing the deterioration of jigs formed of SiC.

Although the silicon nitride etch rate in Comparative example 2 that heats the reaction tube 2 at 400° C. is high as compared with those in Example 1 and Comparative example 1, in Comparative example 2 quartz and SiC are etched at high etch rates. Consequently, as shown in FIGS. 3 and 4, the $Si_3N_4$ selectivities with respect to quartz and SiC are low. Thus when silicon nitride deposited in the thermal processing apparatus 1 is removed in Comparative example 2, the reaction tube 2 of quartz and the jigs of SiC inevitably deteriorate.

It is proved from the above experiments that it is preferable to heat the reaction tube 2 at a low temperature of 300° C. lower than 400° C. and to use a cleaning gas containing chlorine gas to etch silicon nitride at a high etch rate without decreasing $Si_3N_4$ selectivity (maintaining $Si_3N_4$ selectivity at a high level).

It is preferable to heat the interior of the reaction tube 2 at a temperature below 400° C. for the cleaning step, because it is possible that the reaction vessel 2 of quartz and the jigs of SiC are deteriorated when the interior of the reaction tube 2 is heated at temperatures above 400° C. More preferably, the temperature in the reaction tube 2 for the cleaning step is in the range of 250° C. to 380° C. The cleaning gas is not satisfactorily activated, silicon nitride etch rate is low and silicon nitride cannot be etched at a desirable etch rate, if the temperature in the reaction tube 2 is below 250° C. Quartz and SiC are etched at high etch rates and $Si_3N_4$ selectivity is low, if the temperature in the reaction tube 2 is higher than 380° C.

The cleaning gas containing chlorine gas is capable of etching silicon nitride at a high etch rate, and hence the temperature in the reaction tube 2 in the cleaning step can further be lowered when the cleaning gas containing chlorine gas is used. The deterioration of the reaction tube 2 and the jigs can be suppressed by heating the interior of the reaction tube 2 at lower temperatures.

Preferably the cleaning gas contains nitrogen gas as a diluent gas. Due to the dilution of the cleaning gas with nitrogen gas, the duration of the cleaning process can be easily set. A cleaning gas not containing nitrogen gas is highly reactive. Therefore, the duration of the cleaning process must precisely be determined with difficulty if a cleaning gas not containing nitrogen gas is to be used. The dilution of the cleaning gas with nitrogen gas is economically advantageous.

EXAMPLES 2 TO 5

Figure 6:
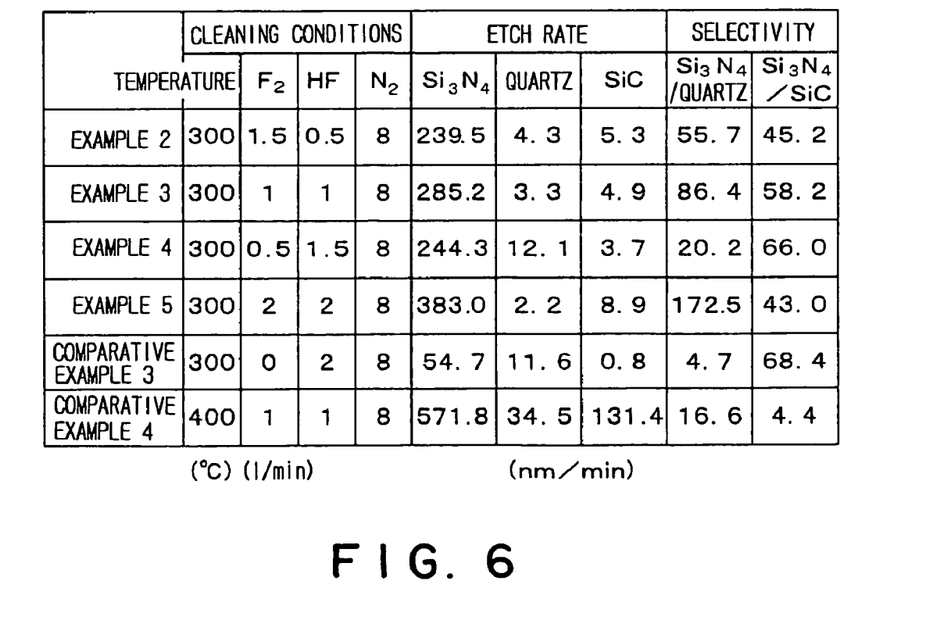
FIG. 6 is a table of cleaning conditions and results of execution of the thermal film deposition apparatus cleaning method using hydrogen fluoride gas as an additive gas.
Figure 7:
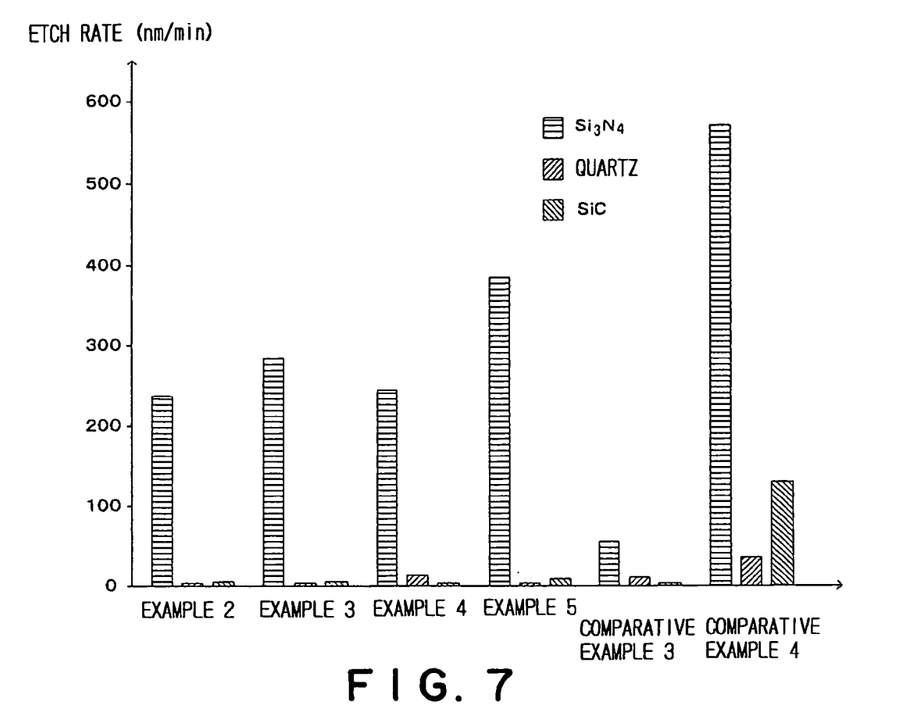
FIG. 7 is a graph showing etch rates at which materials are etched by using cleaning gases containing hydrogen fluoride gas as an additive gas.
Figure 8:
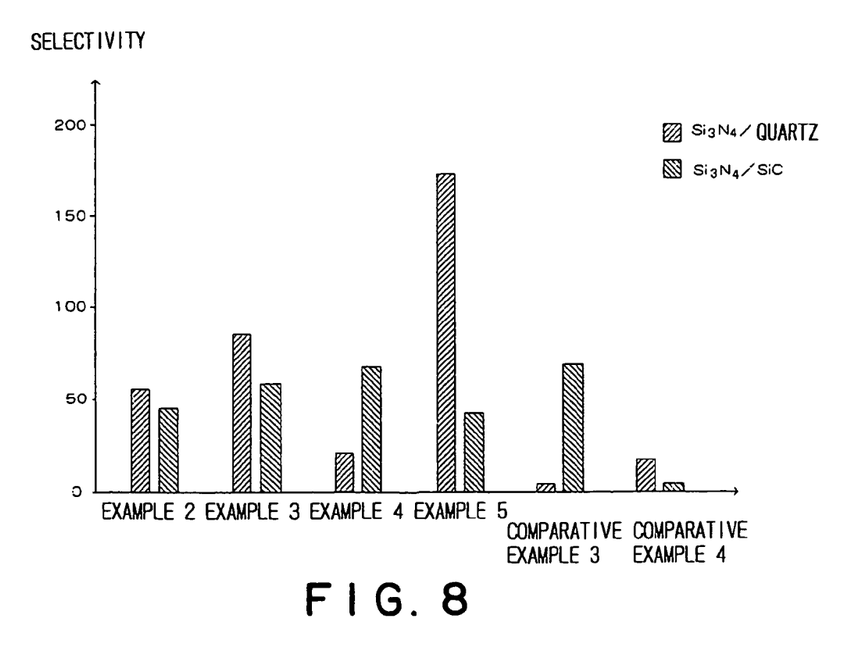
FIG. 8 is a graph showing selectivities with respect to materials when cleaning gases containing hydrogen fluoride gas as an additive gas are used.

In thin film deposition apparatus cleaning methods in Examples 2 to 5, cleaning gases containing HF gas are used as an additive gas. Etch rates and selectivities in Examples 2 to 5 were determined by a method similar to that of Example 1. In a thin film deposition apparatus cleaning method in Example 2, fluorine gas, hydrogen fluoride gas and nitrogen gas at 1.5 l/min, 0.5 l/min and 8 l/min were supplied respectively. That is to say a cleaning gas at 10 l/min in total into the inner tube 3 heated at 300° C. and maintained at a pressure of 53,200 Pa (400 torr). In the thin film deposition apparatus cleaning methods in Examples 3 to 5, cleaning gases having fluorine gas concentrations and hydrogen fluoride concentrations different from those of the cleaning gas used in Example 2 were used. In a thin film deposition apparatus cleaning method in Comparative example 3, a cleaning gas containing hydrogen fluoride gas and nitrogen gas was used and the reaction tube 2 was heated at 300° C. In a thin film deposition apparatus cleaning method in Comparative example 4, fluorine gas, hydrogen fluoride gas and nitrogen gas were supplied at 1 l/min, 1 l/min and 8 l/min, respectively. That is to say, cleaning gas was supplied in total at 10 l/min into the reaction tube 2 heated at 400° C. FIGS. 6 to 8 show measured results.

It is obviously known, from the comparative examination of data on the result of cleaning in Comparative example 1 using the cleaning gas not containing hydrogen fluoride gas shown in FIGS. 3 and 4, and data shown in FIGS. 6, 7 and 8, that the cleaning gas containing hydrogen fluoride gas is capable of etching silicon nitride at a high etch rate and has high $Si_3N_4$ selectivities with respect to quartz and SiC. The cleaning gas containing hydrogen fluoride gas, similarly to the cleaning gas containing chlorine gas, is capable of removing silicon nitride adhering to the inner surfaces of the reaction tube without deteriorating the reaction tube 2 and the jigs.

It is known from data on the result of cleaning by Examples 2 to 4 that it is preferable to supply the cleaning gas into the inner tube 3 so that the flow rate ratio between fluorine gas and hydrogen fluoride gas is in the range of 1:3 to 3:1. A cleaning gas having such fluorine gas and hydrogen fluoride gas concentrations is capable of etching silicon nitride at a high etch rate.

Particularly, the cleaning gas used in Example 3 and supplied so that the flow rate ratio between fluorine gas and hydrogen fluoride gas is 1:1, can further increase silicon nitride etch rate and further decrease quartz etch rate. Consequently, the $Si_3N_4$ selectivity with respect to quartz can further be increased, and hence silicon nitride adhering to the inner surfaces of the reaction tube 2 can be removed without deteriorating the reaction tube 2 and the jigs.

As is apparent from data on the result of cleaning by Example 5, silicon nitride etch rate can further be increased and quartz etch rate can further be decreased when fluorine gas and hydrogen fluoride gas are supplied at an increase flow rate of 2 l/min. Thus, it is preferable to increase the respective flow rates of fluorine gas and hydrogen fluoride gas, while maintaining the flow rate ratio between fluorine gas and hydrogen fluoride gas at 1:1.

As is apparent from data on the result of cleaning by Example 3 and Comparative example 4, although silicon nitride etch rate increases when the temperature of the reaction tube 2 is raised from 300° C. to 400° C., quartz etch rate and SiC etch rate increases greatly and, consequently, $Si_3N_4$ selectivity decreases. Thus, it was proved that it is preferable that in the cleaning process, similarly to the cleaning process using the cleaning gas containing chlorine gas, the interior of the reaction tube 2 was at 300° C. lower than 400° C. and a cleaning gas containing hydrogen fluoride gas was used to enhance silicon nitride etch rate without decreasing $Si_3N_4$ selectivity (maintaining $Si_3N_4$ selectivity at a high level). It is preferable that in the cleaning step using the cleaning gas containing hydrogen fluoride gas, similarly to the cleaning step using the cleaning gas containing chlorine gas, heats the interior of the reaction tube 2 was heated, for the cleaning step, at temperatures below 400° C. More preferably, the temperature in the reaction tube for the cleaning step is in the range of 250° C. to 380° C.

EXAMPLES 6 TO 8

In thin film deposition apparatus cleaning methods in Examples 6 to 8, cleaning gases containing ammonia gas were used as an additive gas. Etch rates and selectivities in by Examples 6 to 8 were determined by a method similar to that in Example 1. In a thin film deposition apparatus cleaning method in Example 6, fluorine gas, ammonia gas and nitrogen gas at 1.78 l/min, 0.17 l/min and 8.05 l/min were supplied, respectively. That is to say, a cleaning gas was supplied in total at 10 l/min into the inner tube 3 heated at 300° C. and maintained at a pressure of 53,200 Pa (400 torr). In thin film deposition apparatus cleaning methods in Examples 7 and 8, cleaning gases having fluorine gas concentrations and ammonia gas concentrations different from those of the cleaning gas used in Example 6 were used. Measured data on the result of cleaning by Examples 6 to 8 is shown in FIGS. 9 to 11.

Figure 9:
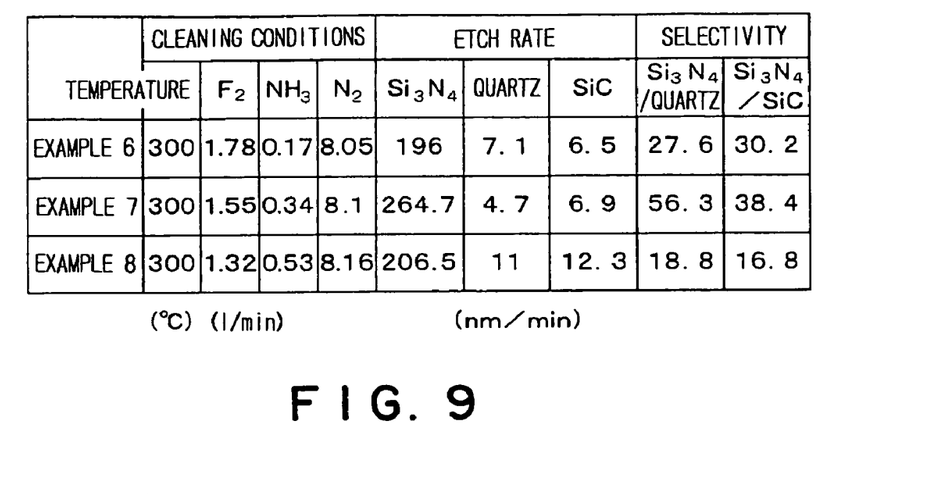
FIG. 9 is a table of cleaning conditions and results of execution of the thermal film deposition apparatus cleaning method using ammonia gas as an additive gas.
Figure 10:
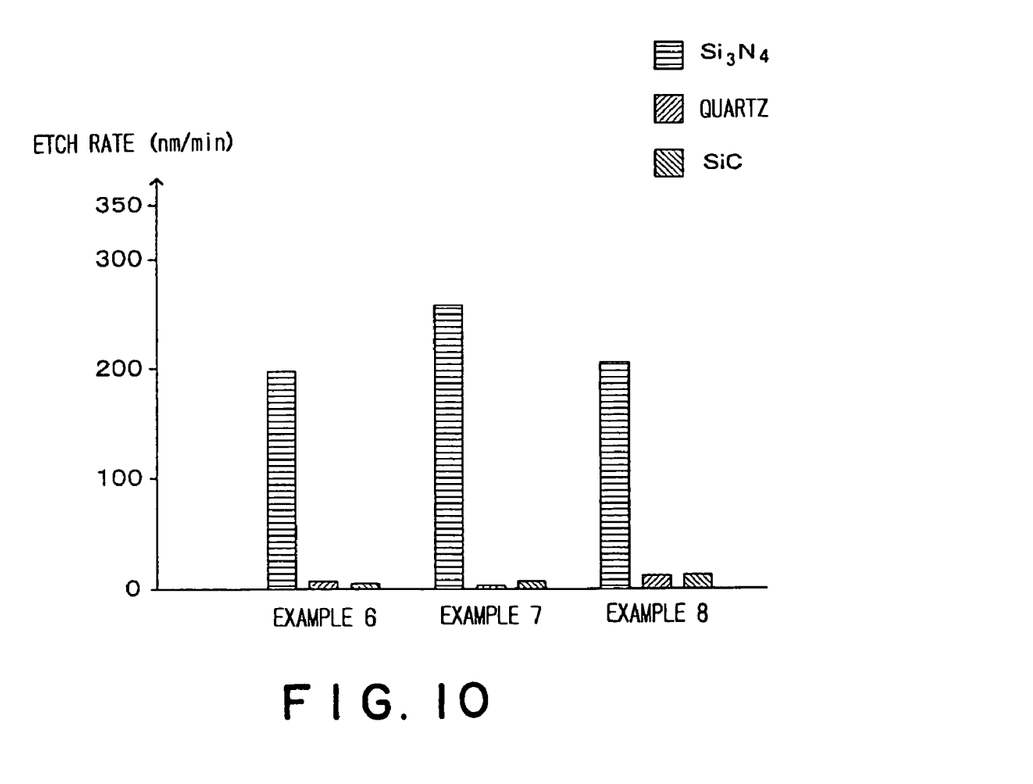
FIG. 10 is a graph showing etch rates at which materials are etched by using cleaning gases containing ammonia gas as an additive gas.
Figure 11:
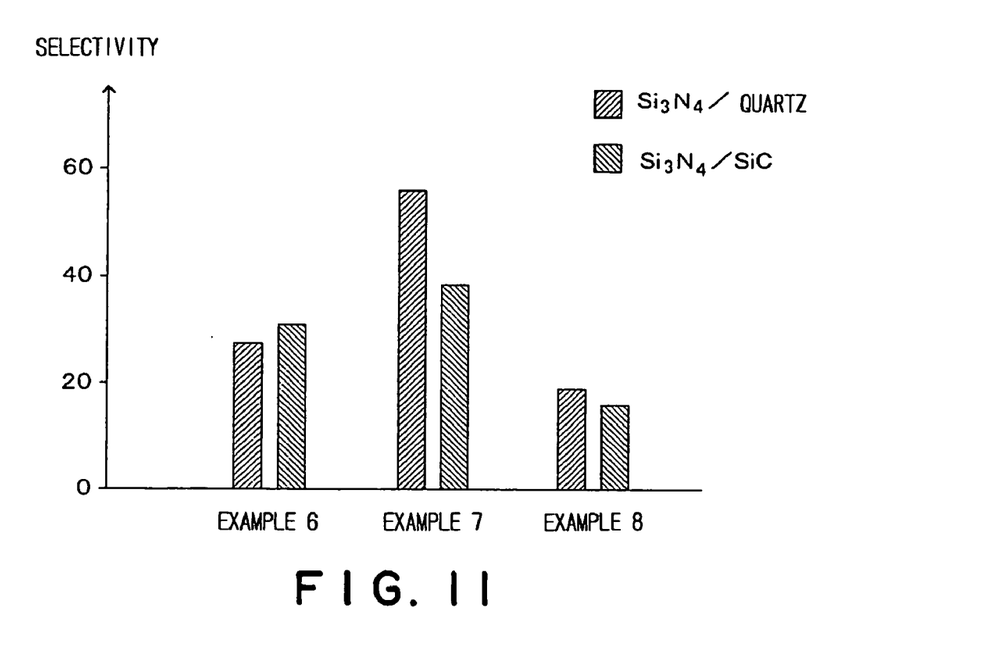
FIG. 11 is a graph showing selectivities with respect to materials when cleaning gases containing ammonia gas as an additive gas are used.

It is obviously known, from the comparative examination of data on the result of cleaning in Comparative example 1 using the cleaning gas not containing ammonia gas shown in FIGS. 3 and 4, and data shown in FIGS. 9 and 10, that the cleaning gas containing ammonia gas is capable of etching silicon nitride at a high etch rate and has high $Si_3N_4$ selectivities with respect to quartz and SiC as shown in FIGS. 9 and 11. The cleaning gas containing ammonia gas, similarly to the cleaning gas containing chlorine gas, is capable of removing silicon nitride adhering to the inner surfaces of the reaction tube 2 without deteriorating the reaction tube 2 and the jigs.

It is preferable to supply the cleaning gas into the inner tube 3 like Examples 6 to 8, such that the flow rate ratio between fluorine gas and ammonia gas is in the range of 2:1 and 10:1. Such a cleaning gas is capable of etching silicon nitride at a high etch rate. It is more preferable to supply the cleaning gas into the inner tube 3 such that the flow rate ratio between fluorine gas and ammonia gas is in the range of 3:1 and 7:1. Particularly, the cleaning gas supplied such that the flow rate ratio between fluorine gas and ammonia gas in carrying out Example 7 is about 4.5:1, can increases silicon nitride etch, and decrease quartz etch rate. Thus, silicon nitride selectivity with respect to quartz can be increased. Consequently, silicon nitride adhering to the inner surfaces of the reaction tube 2 can be removed without deteriorating the reaction tube 2 and the like.

EXAMPLES 9 TO 11

In thin film deposition apparatus cleaning methods in Examples 9 to 11, cleaning gases containing hydrogen gas were used as an additive gas. Etch rates and selectivities in Examples 9 to 11 were determined by a method similar to that of Example 1. In a thin film deposition apparatus cleaning method in Example 9, fluorine gas, hydrogen gas and nitrogen gas at 1.78 l/min, 0.37 l/min and 8 l/min were supplied respectively. That is to say, a cleaning gas was in total supplied at 10.12 l/min into the inner tube 3 heated at 300° C. and maintained at a pressure of 53,200 Pa (400 torr). In thin film deposition apparatus cleaning methods in Examples 10 and 11, cleaning gases having fluorine gas concentrations and hydrogen gas concentrations different from those of the cleaning gas used in Example 9 were used. Measured data on the result of cleaning in Examples 9 to 11 is shown in FIGS. 12 to 14.

Figure 12:
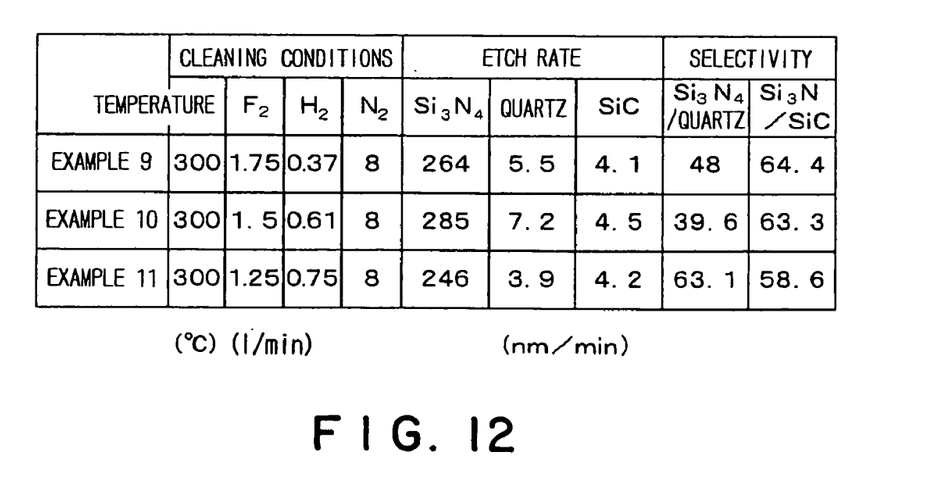
FIG. 12 is a table of cleaning conditions and results of execution of the thermal film deposition apparatus cleaning method using hydrogen gas as an additive gas.
Figure 13:
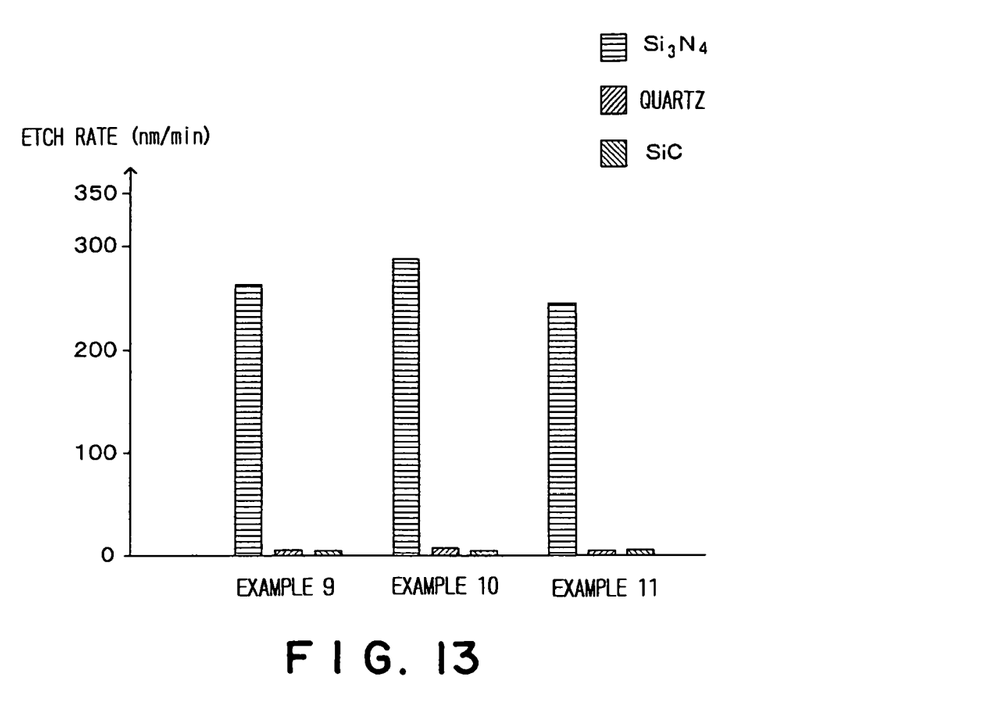
FIG. 13 is a graph showing etch rates at which materials are etched by using cleaning gases containing hydrogen gas as an additive gas.
Figure 14:
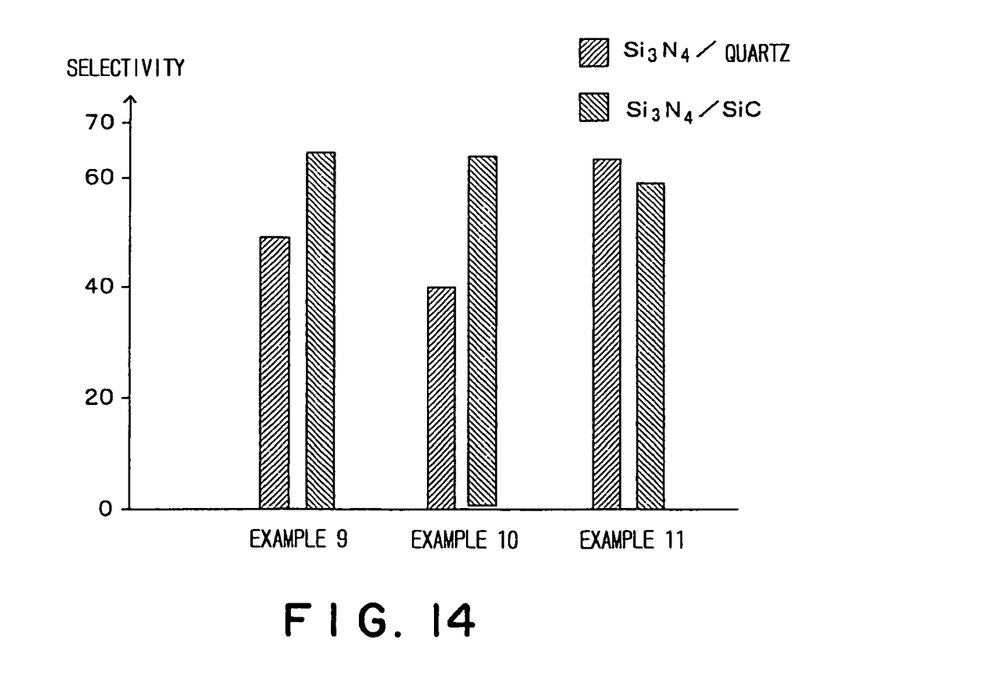
FIG. 14 is a graph showing selectivities with respect to materials when cleaning gases containing hydrogen gas as an additive gas are used.

It is obviously known, from the comparative examination of data on the result of cleaning in Comparative example 1 using the cleaning gas not containing hydrogen gas shown in FIGS. 3 and 4, and data shown in FIGS. 12 and 13, that the cleaning gas containing hydrogen gas is capable of etching silicon nitride at a high etch rate and has high $Si_3N_4$ selectivities with respect to quartz and SiC as shown in FIGS. 12 and 14. The cleaning gas containing hydrogen gas, similarly to the cleaning gas containing chlorine gas, is capable of removing silicon nitride adhering to the inner surfaces of the reaction tube 2 without deteriorating the reaction tube 2 and the jigs.

It is preferable to supply the cleaning gas into the inner tube 3 like Examples 9 to 11, such that the flow rate ratio between fluorine gas and hydrogen gas is in the range of 5:1 and 5:3. Such a cleaning gas is capable of etching silicon nitride at a high etch rate. It was verified that the silicon nitride etching effect of the cleaning gas does not change significantly even if the flow rate ratio between fluorine gas and hydrogen gas changes in the range of 5:1 and 5:3. Therefore, high silicon nitride etch rate can be achieved even if the flow rate of hydrogen is not controlled precisely. Thus, the use of hydrogen gas as an additive gas can facilitate the control of the flow rate of the additive gas.

Quartz etch rate does not increase even if the flow rate of hydrogen gas is increase so that the flow rate ratio between fluorine gas and hydrogen gas is 5:3 (Example 11). Consequently, the $Si_3N_4$ selectivity with respect to quartz can further be increased and silicon nitride adhering to the inner surfaces of the reaction tube 2 can be removed without deteriorating the reaction tube 2 and the like.

As is apparent from the foregoing description, according to the present invention, the cleaning gas containing the additive gas is capable of etching silicon nitride at a high etch rate without heating the reaction tube 2 at an elevated temperature. Since the $Si_3N_4$ selectivity does not decrease when the cleaning gas containing the additive gas is used, and hence the reaction tube and the jigs are not deteriorated easily. Consequently, silicon nitride adhering to the inner surfaces of the thermal processing apparatus can be removed without deteriorating the reaction tube 2 and the jigs.

According to the present invention, the cleaning gas containing the additive gas is capable of etching silicon nitride at a high etch rate, and hence the reaction tube 2 may be heated at a comparatively low temperature for the cleaning step, which further reduces the deteriorating effect of the cleaning step on the reaction tube 2 and the jigs.

According to the present invention, the cleaning gas containing nitrogen gas as a diluent can facilitate setting a cleaning time for the cleaning process.

The present invention is not limited in its practical application to the foregoing embodiments, and various modifications of the foregoing embodiments and applications of those are possible. Modifications according to the present invention will be described.

The cleaning gas may contain any type of gas as an additive gas, provided that the additive gas is capable of promoting the activation of fluorine gas. Such a cleaning gas etches silicon nitride at a high etch rate. The cleaning gas may contain any type of additive gas, provided that the cleaning gas is capable of etching silicon nitride at a high etch rate without decreasing $Si_3N_4$ selectivity with respect to materials forming the internal members of the thermal processing apparatus 1, such as quartz and SiC. The reaction tube 2 and the jigs are not deteriorated significantly when the cleaning gas has a high $Si_3N_4$ selectivity. The additive gas may be a halogen gas, such as bromine gas ($Br_2$) instead of chlorine gas, hydrogen fluoride gas, ammonia gas or hydrogen gas.

Although the invention has been described as applied to removing silicon nitride deposited on the inner surfaces of the thermal processing apparatus 1, the present invention is applicable to removing deposits other than the silicon nitride deposit; the present invention can be applied to removing, for example, polysilicon, titanium oxide, tantalum oxide, silica, silicone-germanium (SiGe), BSTO ($BaSrTiO_3$) and STO ($SrTiO_3$). The deposit is not necessarily a reaction product, and may be a reaction byproduct, such as ammonium chloride.

When the reaction product, such as silicon nitride, and a reaction byproduct, such as ammonium chloride or a Si—Cl—N—H compound, deposited particularly on the inner surface of the exhaust pipe 17 of the thermal processing apparatus 1, those deposits can effectively be removed with the cleaning gas containing fluorine gas and the additive gas that promotes the activation of fluorine gas.

To remove the deposits deposited on the inner surface of the exhaust pipe 17, the cleaning gas is supplied through the reaction tube 2 into the exhaust pipe 17. The cleaning gas may be supplied through an inlet port 17a formed in the exhaust pipe 17 into the exhaust pipe 17. The deposits deposited on the inner surface of the exhaust pipe 17 can effectively removed by heating the exhaust pipe 17 with an exhaust pipe heater 17b.

Although the foregoing embodiments of the present invention use the cleaning gases containing nitrogen gas as the diluent gas, the cleaning gases do not necessarily need to contain the diluent gas. However, it is preferable to use a cleaning gas containing a diluent gas because the cleaning gas containing the diluent gas facilitates setting a cleaning time for the cleaning process. Preferably, the diluent gas is an inert gas. For example, helium gas (He), neon gas (Ne) or argon gas (Ar) may be used instead of nitrogen gas.

Although the foregoing embodiments of the present invention sets the pressure in the reaction tube 3 at 53,200 Pa (400 torr) to clean the interior of the thermal processing apparatus 1, the pressure in the reaction tube 3 is not limited thereto. The cleaning of the thermal processing apparatus 1 may be carried out once every several cycles of the film deposition process or once every one cycle of the film deposition process. The life of the internal components formed of quartz and SiC of the thermal processing apparatus 1 can further be extended by cleaning the interior of the thermal processing apparatus once every one cycle of the film deposition process.

Although the invention has been described as applied to cleaning the batch-furnace vertical thermal processing apparatus provided with the double-wall reaction tube 2 consisting of the inner tube 3 and the outer tube 4, the present invention is not limited thereto in its practical application. For example, the present invention is applicable to cleaning a batch-furnace thermal processing apparatus provided with a reaction tube not having any tube corresponding to the inner tube 3. The workpieces are not limited to semiconductor wafers 10, and may be, for example, glass substrates for LCDs.

As is apparent from the foregoing description, according to the present invention, the deposits deposited in the thermal processing apparatus can be removed without significantly deteriorating the reaction vessel and the jigs.

What is claimed is:

1. A thin film deposition apparatus cleaning method of cleaning a thin film deposition apparatus by removing deposits adhering to the inner surfaces of the thin film deposition apparatus after depositing thin films on workpieces by supplying a process gas into a reaction vessel included in the thin film deposition apparatus, said thin film deposition apparatus cleaning method comprising the steps of:

discharging the workpieces having the deposited thin films from the reaction vessel;

heating an interior of the reaction vessel at a predetermined temperature after discharging the workpieces; and cleaning an interior of the thin film deposition apparatus, with no workpieces being in the reaction vessel, by supplying a cleaning gas containing fluorine gas and an additive gas capable of promoting the activation of the fluorine gas into the reaction vessel heated at the predetermined temperature, heating the cleaning gas at a predetermined temperature to activate the fluorine gas contained in the cleaning gas, and removing the deposits with the activated fluorine gas.

2. The thin film deposition apparatus cleaning method according to claim 1, wherein the deposits are removed and the interior of the thin film deposition apparatus is cleaned by supplying the cleaning gas containing fluorine gas and the additive gas capable of promoting the activation of the fluorine gas and of increasing etch rate for the deposits without decreasing selectivity with respect to the materials forming the internal members of the thin film deposition apparatus, into the reaction vessel in the cleaning step.

3. The thin film deposition apparatus cleaning method according to claim 2, wherein the additive gas is chlorine gas, hydrogen fluoride gas, ammonia gas or hydrogen gas.

4. The thin film deposition apparatus cleaning method according to claim 3, wherein the deposits are removed to clean the interior of the thin film deposition apparatus by supplying a cleaning gas containing fluorine gas and chlorine gas into the reaction vessel heated at the predetermined temperature in the cleaning step.

5. The thin film deposition apparatus cleaning method according to claim 3, wherein the deposits are removed to clean the interior of the thin film deposition apparatus by supplying a cleaning gas containing fluorine gas and hydrogen fluoride gas into the reaction vessel heated at a predetermined temperature in the cleaning step.

6. The thin film deposition apparatus cleaning method according to claim 3 or 5, wherein the cleaning gas containing fluorine gas and hydrogen fluoride gas is supplied such that the flow rate ratio between fluorine gas and hydrogen fluoride gas is in the range of 1:3 to 3:1.

7. The thin film deposition apparatus cleaning method according to claim 6, wherein the cleaning gas containing fluorine gas and hydrogen fluoride gas is supplied such that the flow rate ratio between fluorine gas and hydrogen fluoride gas is 1:1.

8. The thin film deposition apparatus cleaning method according to claim 7, wherein fluorine gas and hydrogen fluoride gas are supplied at a flow rates not lower than 2 l/min respectively.

9. The thin film deposition apparatus cleaning method according to claim 3, wherein the deposits are removed to clean the interior of the thin film deposition apparatus by supplying a cleaning gas containing fluorine gas and ammonia gas into the reaction vessel heated at a predetermined temperature in the cleaning step.

10. The thin film deposition apparatus cleaning method according to claim 9, wherein the cleaning gas containing fluorine gas and ammonia gas is supplied such that the flow rate ratio between fluorine gas and ammonia gas is in the range of 2:1 to 10:1.

11. The thin film deposition apparatus cleaning method according to claim 3, wherein
the deposits are removed to clean the interior of the thin film deposition apparatus by supplying a cleaning gas containing fluorine gas and hydrogen gas into the reaction vessel heated at a predetermined temperature in the cleaning step.

12. The thin film deposition apparatus cleaning method according to claim 11, wherein
the cleaning gas containing fluorine gas and hydrogen gas is supplied such that the flow rate ratio between fluorine gas and hydrogen gas is in the range of 5:1 to 5:3.

13. The thin film deposition apparatus cleaning method according to claim 12, wherein the cleaning gas containing fluorine gas and hydrogen gas is supplied such that the flow rate ratio between fluorine gas and hydrogen gas is 5:3.

14. The thin film deposition apparatus cleaning method according to claim 1, wherein internal members of the thin film deposition apparatus are formed of at least either quartz or silicon carbide.

15. The thin film deposition apparatus cleaning method according to claim 1, wherein
the interior of the reaction vessel is heated at a temperature below 400° C. in the heating step.

16. The thin film deposition apparatus cleaning method according to claim 15, wherein
the interior of the reaction vessel is heated at a temperature in the range of 250° C. to 380° C. in the heating step.

17. The thin film deposition apparatus cleaning method according to claim 1, wherein
the cleaning gas is diluted with a diluent gas to produce a diluted cleaning gas, and the diluted cleaning gas is supplied into the reaction vessel.

18. The thin film deposition apparatus cleaning method according to claim 17, wherein
the diluent gas is an inert gas.

19. The thin film deposition apparatus cleaning method according to claim 1, wherein
thin films formed on the workpieces are silicon nitride films, and
the silicon nitride deposited in the thin film deposition apparatus is removed in the cleaning step, when depositing the silicon nitride films on the workpieces with the cleaning gas.

20. A thin film deposition apparatus cleaning method of cleaning a thin film deposition apparatus by removing deposits adhering to the inner surface of an exhaust pipe after forming thin films on workpieces by supplying a process gas into a reaction vessel included in the thin film deposition apparatus, and discharging gases from the reaction vessel into the exhaust pipe, said thin film deposition apparatus cleaning method comprising the steps:
discharging the workpieces having the deposited thin films from the reaction vessel;
heating an interior of the exhaust pipe at a predetermined temperature after discharging the workpieces; and
cleaning an interior of the exhaust pipe, with no workpieces being in the reaction vessel by supplying a cleaning gas containing fluorine gas, and an additive gas capable of promoting the activation of the fluorine gas into the exhaust pipe heated at the predetermined temperature in the heating step, heating the cleaning gas at a predetermined temperature to activate the fluorine gas contained in the cleaning gas, and removing the deposits with the activated fluorine gas.

21. The thin film deposition apparatus cleaning method according to claim 20 wherein
the cleaning gas is supplied through the reaction vessel into the exhaust pipe.

22. The thin film deposition apparatus cleaning method according to claim 20, wherein
the cleaning gas is supplied through an inlet port formed in the exhaust pipe into the exhaust pipe.

* * * * *